(12) United States Patent
Kalyanamahadevi Gopalan Jawarlal et al.

(10) Patent No.: US 10,917,076 B1
(45) Date of Patent: Feb. 9, 2021

(54) RING OSCILLATOR AND METHOD FOR CONTROLLING START-UP OF RING OSCILLATOR

(71) Applicant: Samsung Electronics Co., Ltd., Suwon-si (KR)

(72) Inventors: Vishnu Kalyanamahadevi Gopalan Jawarlal, Bangalore (IN); Tamal Das, West Bengal (IN); Avneesh Singh Verma, Bangalore (IN); Sanjeeb Kumar Ghosh, Bangalore (IN)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/818,174

(22) Filed: Mar. 13, 2020

(30) Foreign Application Priority Data

Aug. 2, 2019 (IN) .............................. 201941031402

(51) Int. Cl.
  *H03K 3/03* (2006.01)
  *H03K 3/014* (2006.01)
  *H03K 3/011* (2006.01)

(52) U.S. Cl.
  CPC ........... *H03K 3/0322* (2013.01); *H03K 3/011* (2013.01); *H03K 3/014* (2013.01); *H03B 2200/0094* (2013.01)

(58) Field of Classification Search
  CPC .. H03B 5/06; H03B 2200/0094; H03K 3/011; H03K 3/014; H03K 3/0315; H03K 3/0322; H03L 3/00
  USPC .......................................................... 331/57
  See application file for complete search history.

(56) References Cited

U.S. PATENT DOCUMENTS

| | | | |
|---|---|---|---|
| 6,515,550 B2 | 2/2003 | Demsky | |
| 7,719,373 B2 | 5/2010 | Ryckaert | |
| 8,183,939 B1 | 5/2012 | Kumar | |
| 8,441,095 B2 | 5/2013 | Kanno | |
| 8,610,511 B1* | 12/2013 | Elrabaa | H03K 3/0315 |
| | | | 331/57 |
| 8,618,889 B2 | 12/2013 | Yoshida | |
| 8,816,782 B2 | 8/2014 | Chang | |
| 8,994,452 B2 | 3/2015 | Kim | |
| 9,444,433 B2 | 9/2016 | Visweswaran | |
| 9,979,284 B2* | 5/2018 | Jung | H03K 19/01750 |
| 10,396,807 B1* | 8/2019 | Dai | H03L 7/24 |

(Continued)

FOREIGN PATENT DOCUMENTS

JP  2014045359  3/2014

OTHER PUBLICATIONS

Yan et al., "Verifying Global Start-Up for a Mobius Ring-Oscillator", Formal Methods in System Design, Jun. 13, 2013 (28 pages).

(Continued)

*Primary Examiner* — Levi Gannon
(74) *Attorney, Agent, or Firm* — Myers Bigel, P.A.

(57) ABSTRACT

A ring oscillator includes at least one oscillator stage having a first output and a second output and a start-up circuit. The start-up circuit includes a plurality of AC coupling capacitors receiving the first output and the second output, and a plurality of switches connected to the AC coupling capacitors. The start-up circuit is configured to provide a differential start-up voltage to at least one node of the oscillator using the plurality of switches and the AC coupling capacitors.

19 Claims, 16 Drawing Sheets

(56) References Cited

U.S. PATENT DOCUMENTS

| | | | |
|---|---|---|---|
| 2011/0298549 A1* | 12/2011 | Luong | H03L 7/0998 |
| | | | 331/57 |
| 2014/0055204 A1 | 2/2014 | Maruko | |
| 2016/0226501 A1* | 8/2016 | Dicke | H03L 7/0995 |
| 2017/0126176 A1* | 5/2017 | Okamoto | H03B 5/06 |
| 2020/0106423 A1* | 4/2020 | Tang | H03B 5/1212 |

OTHER PUBLICATIONS

Zhang, "Start-up Analysis for Differential Ring Oscillator with Even Number of Stages", Circuits and Systems, IEEE Asia-Pacific Conference, 2010, pp. 636-639.

\* cited by examiner

RING OSCILLATOR AND METHOD FOR CONTROLLING START-UP OF RING OSCILLATOR

CROSS-REFERENCE TO RELATED APPLICATION

This U.S. non-provisional application claims priority under 35 U.S.C. § 119 to Indian Patent Application No. 201941031402, filed on Aug. 2, 2019, in the Indian Patent Office, the entire contents of which are incorporated by reference herein.

FIELD OF INVENTION

The present disclosure relates to a ring oscillator, and is more specifically related to a method for controlling start-up of the ring oscillator.

BACKGROUND

A ring oscillator (e.g., an even staged CMOS ring oscillator or the like) can have two stable equilibrium points at which the ring oscillator latches up (e.g., maintains a constant output) and one unstable equilibrium point that oscillates. In order to control start-up of the ring oscillator, various methods and circuit arrangements are used for adjusting latch gain appropriately or initializing the ring oscillator to the unstable equilibrium point. In some existing methods, in order to control the start-up of the ring oscillator, a startup control circuit is implemented to support high supply voltages. In some existing methods, in order to control the start-up of the ring oscillator, the start-up circuit is implemented using a capacitor charging mechanism and Schmitt triggers. In some existing methods, in order to control the start-up of the ring oscillator, a startup pulse is applied following a different scheme across stages. In some existing methods, in order to control the start-up of the ring oscillator, direct current (DC) coupling is used to initialize oscillator nodes. In some existing methods, in order to control the start-up of the ring oscillator, a Schmitt trigger with a common mode sensing amplifier is used for the startup implementation.

Many conventional methods and circuit arrangements have been proposed for controlling the start-up of the ring oscillator, but these conventional methods and circuit arrangements may have disadvantages in terms of power consumption, robustness, reliability, integrity issues, operation dependency, time, cost, complexity, design, leakage current, hardware components used, size and so on.

Thus, it is desired to address the above mentioned disadvantages or other shortcomings or at least provide a useful alternative.

SUMMARY

According to some embodiments of the present inventive concepts, a method for controlling start-up of a ring oscillator includes detecting stable operating points in the ring oscillator, measuring an equivalent impedance value at a node of the ring oscillator in the stable operating points, configuring a start-up circuit using a plurality of switches and a plurality of AC coupling capacitors based on the measured equivalent impedance value, and applying a differential start-up voltage to each pair of nodes of the ring oscillator using the plurality of switches and the plurality of AC coupling capacitors.

According to some embodiments of the present inventive concepts, a ring oscillator includes at least one oscillator stage having a first output and a second output and a start-up circuit. The start-up circuit includes a plurality of AC coupling capacitors receiving the first output and the second output, and a plurality of switches connected to the AC coupling capacitors. The start-up circuit is configured to provide a differential start-up voltage to at least one node of the oscillator using the plurality of switches and the AC coupling capacitors.

According to some embodiments of the present inventive concepts, a ring oscillator includes an even number of stages, where each respective stage is coupled to a duty cycle corrector (DCC). The DCC includes an AC coupling capacitor that is coupled to an input of the DCC, and a first switch coupled to a first voltage and a second switch coupled to a second voltage. The first switch and the second switch are configured to provide a differential start-up voltage to the respective stage of the ring oscillator using the AC coupling capacitor.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF FIGURES

The inventive concepts are illustrated in the accompanying drawings, throughout which like reference letters indicate corresponding parts in the various figures. The embodiments herein will be better understood from the following description with reference to the drawings, in which.

DETAILED DESCRIPTION

Figure 1:
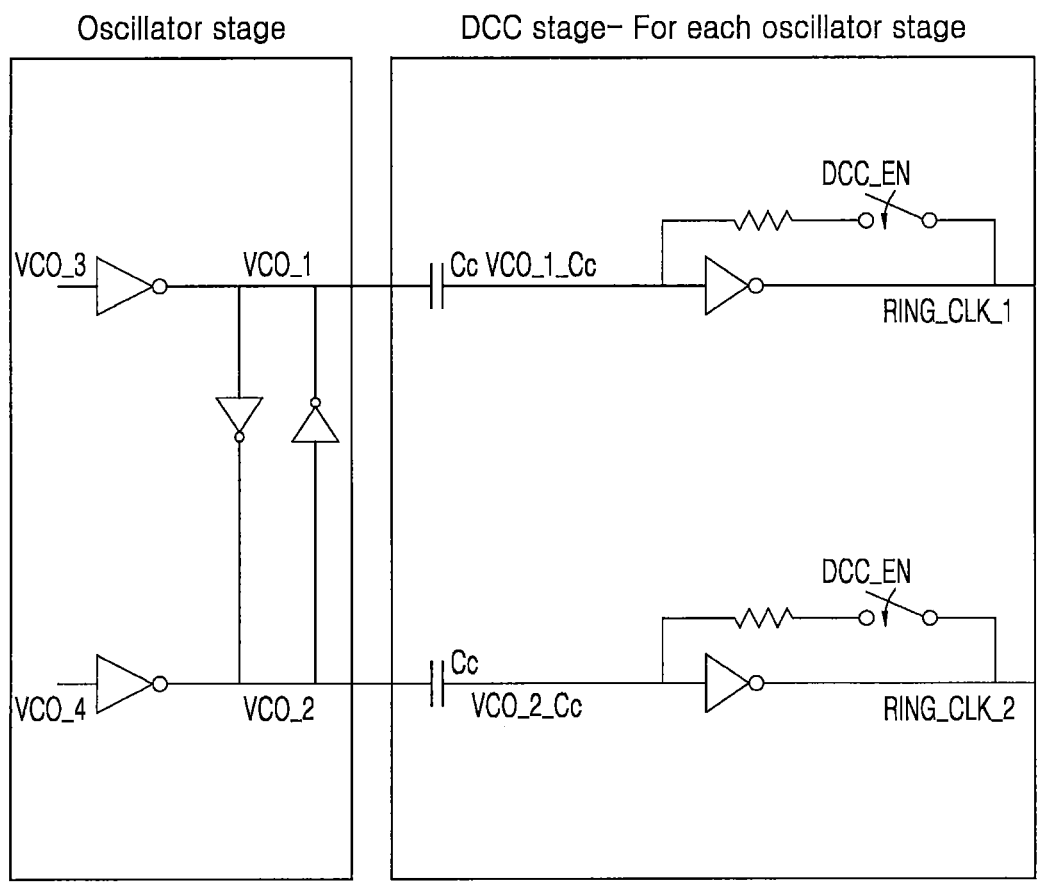
FIG. 1 is a circuit diagram of a stage of a ring oscillator.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. Also, the various embodiments described herein are not necessarily mutually exclusive, as some embodiments can be combined with one or more other embodiments to form new embodiments. The term "or" as used herein, refers to a non-exclusive or, unless otherwise indicated. As used herein, the term "and/or" includes any and all combinations of one or more of the associated listed items. Expressions such as "at least one of," when preceding a list of elements, modify the entire list of elements and do not modify the individual elements of the list. The examples used herein are intended merely to facilitate an understanding of ways in which the embodiments herein can be practiced and to further enable those skilled in the art to practice the embodiments herein. Accordingly, the examples should not be construed as limiting the scope of the embodiments herein.

As is traditional in the field, embodiments may be described and illustrated in terms of blocks which carry out a described function or functions. These blocks, which may be referred to herein as units or modules or the like, are physically implemented by analog or digital circuits such as logic gates, integrated circuits, microprocessors, microcontrollers, memory circuits, passive electronic components, active electronic components, optical components, hardwired circuits, or the like, and may optionally be driven by firmware and software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the invention. Likewise, the blocks of the embodiments may be physically combined into more complex blocks without departing from the scope of the invention.

The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings. Like numbers refer to like elements throughout. Thus, the same or similar numbers may be described with reference to other drawings even if they are neither mentioned nor described in the corresponding drawing. Also, elements that are not denoted by reference numbers may be described with reference to other drawings. Although the terms first, second, etc. may be used herein to describe various elements, these elements should not be limited by these terms. These terms are generally only used to distinguish one element from another.

Accordingly, embodiments herein disclose a method for controlling start-up of a ring oscillator. The method includes detecting stable operating points in the ring oscillator. Further, the method includes measuring an equivalent impedance value at each node of the ring oscillator in the stable operating points. Further, the method includes configuring a start-up circuit using a plurality of switches and a plurality of alternative current (AC) coupling capacitors based on the measured equivalent impedance value at each node of the ring oscillator in the stable operating points. Further, the method includes applying the differential start-up voltage to each pair of nodes of the ring oscillator using the plurality of switches and the plurality of AC coupling capacitors.

Unlike conventional methods and systems, the proposed method utilizes a differential start-up kick mechanism to force the ring oscillator into oscillation even when the ring oscillator is initially latched up in a stable operating point before application of the start-up. The method can be used to reduce power consumption and reduce start-up failure in the ring oscillator.

In the proposed methods and circuits, the differential start-up kick mechanism may force the oscillator state closer to the unstable state than two stable latch up states. The proposed method does not load the oscillator outputs in an active mode and hence there is little or no increase in oscillator power. The method can be used to predict oscillator startup failure using a multi operating point technique in an effective manner.

Based on the proposed methods and circuits, the differential start-up kick mechanism allows the ring oscillator to be designed with a smaller latch ratio (i.e., the latch ratio is the ratio of the cross coupled inverter to the main inverter in each oscillator stage) which may lead to area and power reduction in the ring oscillator.

One object of the embodiments herein is to provide a method and circuit for controlling the start-up of the ring oscillator.

Another object of the embodiments herein is to detect stable operating points in the ring oscillator.

Another object of the embodiments herein is to measure an equivalent impedance value at each node of the ring oscillator in the stable operating points.

Another object of the embodiments herein is to configure a start-up circuit using a plurality of switches and a plurality of AC coupling capacitors based on the measured equivalent impedance value at each node of the ring oscillator in the stable operating points.

Another object of the embodiments herein is to apply the differential start-up voltage to at least one node of the ring oscillator using the plurality of switches and the plurality of AC coupling capacitors.

Another object of the embodiments herein is to provide a differential start-up voltage that starts up oscillations in the ring oscillator when the ring oscillator is latched up in the stable operating points.

Another object of the embodiments herein is to provide that the start-up circuit does not load outputs of the ring oscillator in an active mode.

Referring now to the drawings, and more particularly to FIGS. 2 through 13, there are shown embodiments of the inventive concepts.

FIG. 1 is a circuit diagram of a stage of a ring oscillator. As shown in FIG. 1, each oscillator stage is connected to a duty cycle corrector (DCC) to convert oscillator output amplitude to a CMOS level. The ring oscillator may have an even number of stages with every stage being identical. The DCC may be implemented using an AC coupled inverter.

Figure 2:
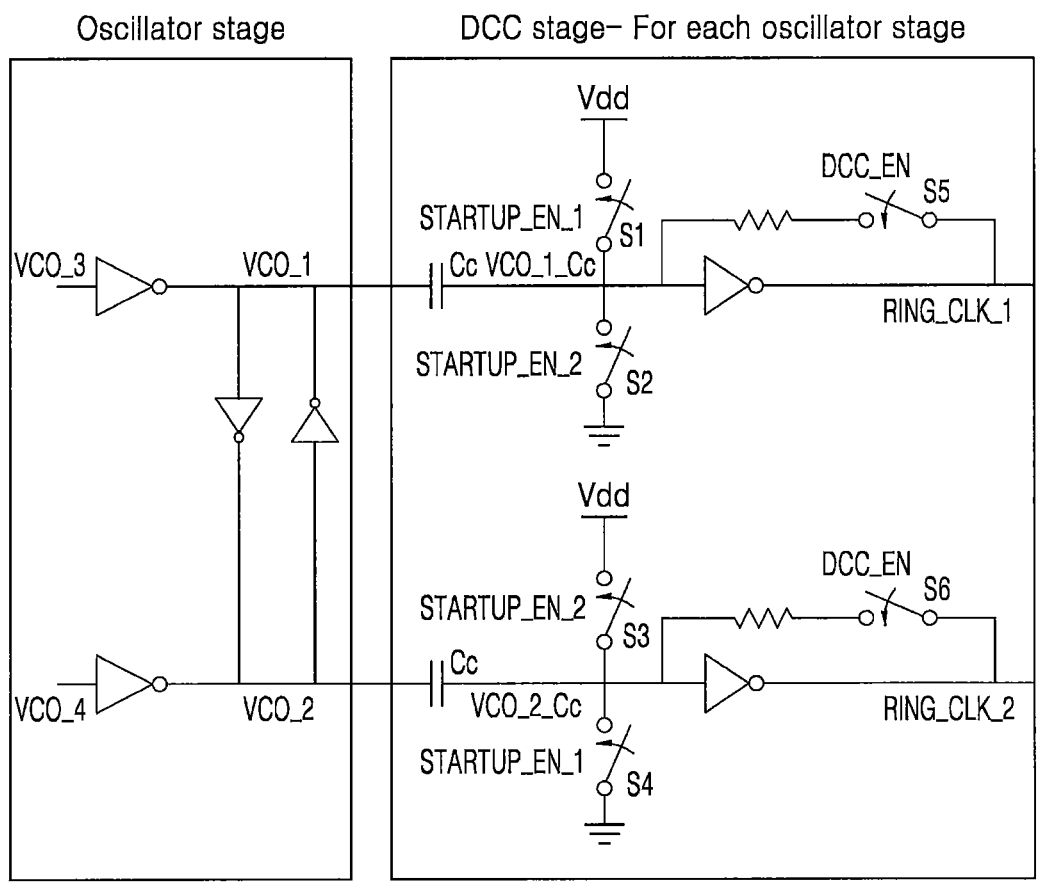
FIG. 2 is a circuit diagram of a stage of a ring oscillator, according to the embodiments as disclosed herein.

FIG. 2 is a circuit diagram of the stage of a ring oscillator, according to the embodiments as disclosed herein. The ring oscillator can be an even staged complementary metal oxide semiconductor (CMOS) ring oscillator.

As shown in FIG. 2, a DCC stage may be connected with a single oscillator stage. As illustrated in FIG. 2, nodes VCO_3 and VCO_4 are inputs of the single oscillator stage and nodes VCO_1 and VCO_2 are outputs of the single oscillator stage. The DCC inputs, after an AC coupling capacitor (Cc), are marked as VCO_1_Cc and VCO_2_Cc. The outputs of the DCC are marked as RING_CLK_1 and RING_CLK_2 in FIG. 2. The supply voltage is marked as Vdd in FIG. 2. The ring oscillator may be made up of identical stages such as those illustrated in FIG. 2. Hence the same structure may be present in all the stages of the ring oscillator and the DCC connected to each stage. Additional switches have been added in the DCC to force a startup differential kick without loading the oscillator outputs in the active mode. These switches may be controlled using signals STARTUP_EN_1 and STARTUP_EN_2, respectively. The latch ratio may be adjusted appropriately in the oscillator stage to solve the start-up failure issue with start-up and also to improve power usage.

In some embodiments, the ring oscillator includes at least one oscillator stage having a first output (VCO_1) and a second output (VCO_2), and a start-up circuit. The start-up circuit may include the plurality of AC coupling capacitors (Cc) receiving the first output (VCO_1) and the second output (VCO_2) and a plurality of switches (S1-S4) (controlled by STARTUP_EN_1 and STARTUP_EN_2) connected to the AC coupling capacitors (Cc). The start-up circuit may be configured to provide a differential start-up voltage to each pair of nodes of the ring oscillator using the plurality of switches (S1-S4) (controlled by STARTUP_EN_1 and STARTUP_EN_2) and the AC coupling capacitors (Cc). The differential start-up voltage may be a pair of voltages provided in the ring oscillator in which one voltage is going in one direction (e.g., rising) in the ring oscillator and another voltage is going in a different direction (e.g., falling) in the ring oscillator at a same instant of time and a level/value of both voltages may be the same amount.

In some embodiments, the start-up circuit may include an inverter that may be bypassed by an additional DCC_EN switch (S5 and S6) (controlled by a DCC_EN signal). The additional DCC_EN switch (S5 and S6) may be configured to bypass the inverter responsive to the DCC_EN signal. Further, the oscillator output swing is converted to the CMOS level using an AC coupled inverter which is designated as DCC since it is useful in duty cycle correction. The DCC_EN signal has to be asserted to set the input common mode of the inverter such that it has a high gain. Without high gain, the DCC cannot convert the oscillator output to the CMOS level. During start-up, the DCC_EN signal is not asserted and the inputs of the inverter are forced to supply or ground using switches (S1-S4).

In some embodiments, the AC coupling capacitors (Cc) and the plurality of switches (S1-S4) (controlled by STARTUP_EN_1 and STARTUP_EN_2) may be configured by a timing circuitry to provide the differential start-up voltage to at least one node of the ring oscillator.

In some embodiments, the differential start-up voltage starts up oscillations in the ring oscillator when the ring oscillator is latched up in a stable operating point. In some embodiments, the start-up circuit does not load output of the ring oscillator in the active mode. In some embodiments, a latch ratio may be adjusted in the oscillator stage to control differential gain in the ring oscillator and may improve start-up voltage requirements and power consumption of the ring oscillator.

In some embodiments, the latch ratio corresponds to a ratio of a cross coupled inverter to a main inverter in the oscillator stage.

In some embodiments, the start-up circuit is configured to provide the differential start-up voltage to at least one node of the ring oscillator using the plurality of switches (S1-S4) (controlled by STARTUP_EN_1 and STARTUP_EN_2) and the AC coupling capacitors (Cc) by detecting stable operating points in the ring oscillator, measuring an equivalent impedance value at each node of the ring oscillator, configuring the start-up circuit using the plurality of switches (S1-S4) (controlled by STARTUP_EN_1 and STARTUP_EN_2) and the plurality of AC coupling capacitors (Cc) based on the measured equivalent impedance value at each node of the ring oscillator and the stable operating points, and applying the differential start-up voltage to each node of the ring oscillator using the plurality of switches (S1-S4) (controlled by STARTUP_EN_1 and STARTUP_EN_2) and the plurality of AC coupling capacitors (Cc).

In some embodiments, the equivalent impedance value at each node of the ring oscillator may be measured by using small signal analysis at the stable operating points. The small signal analysis at the stable operating points may be used for calculating a low and/or minimum differential start-up voltage of the ring oscillator.

In some embodiments, the differential start-up voltage of the ring oscillator may be calculated by determining a supply voltage of the ring oscillator corresponding to every process, voltage and temperature (PVT) condition of the ring oscillator, and computing the differential start-up voltage to be applied based on the detected stable operating points, the unstable equilibrium point, and the determined supply voltage.

In some embodiments, the stable operating points may be identified using a multi operating point check procedure. In some embodiments, stability of all the unstable equilibrium points may be evaluated using Nyquist stability criteria.

Figure 3:
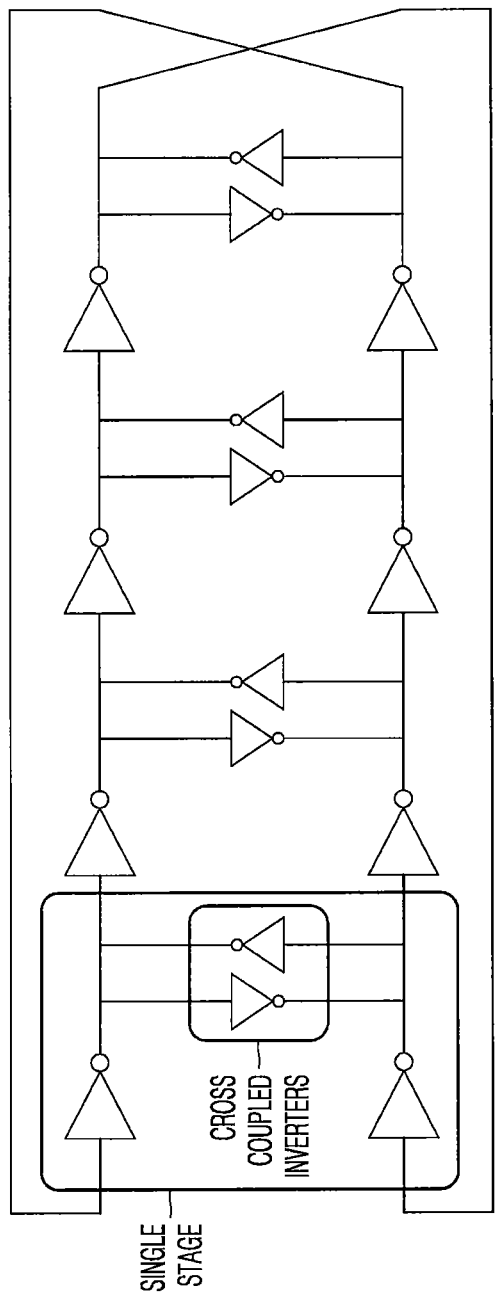
FIG. 3 and FIG. 4 illustrate multiple operating points (MOP) in an even staged CMOS ring oscillator, according to the embodiments as disclosed herein.
Figure 4:
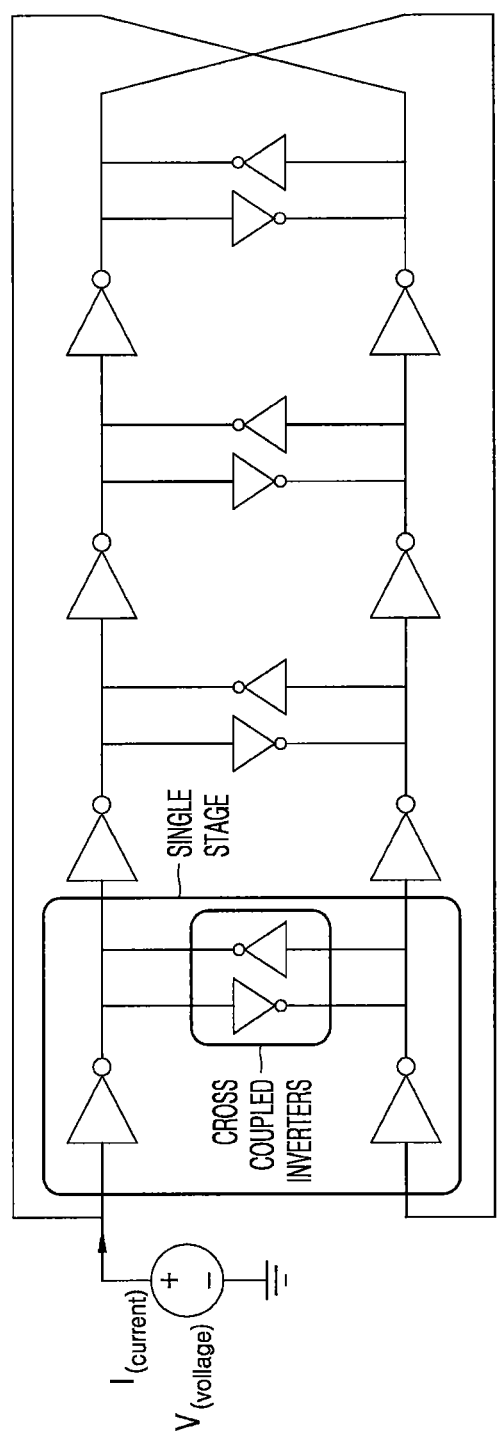
Figure 5:
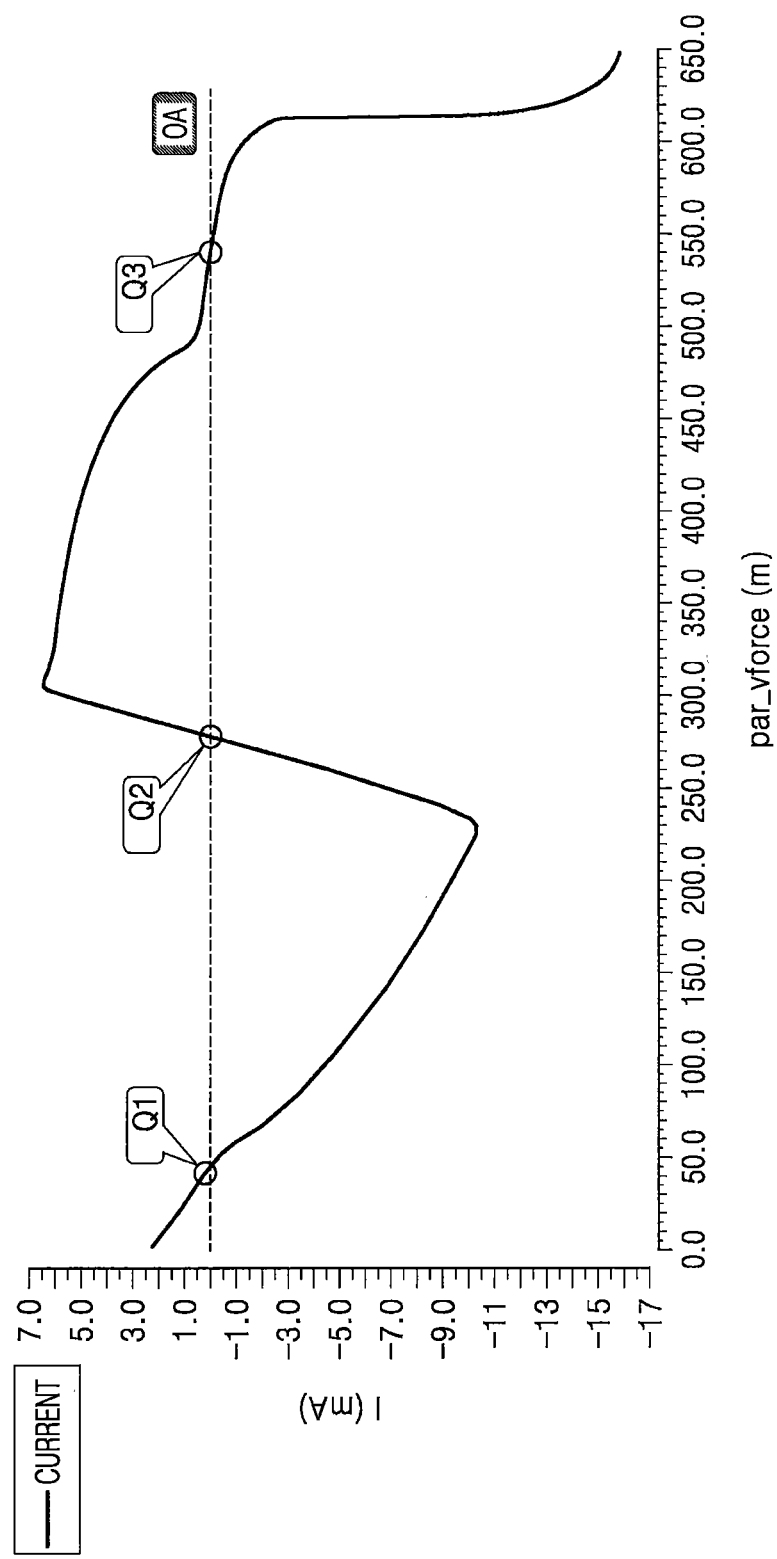
FIG. 5 is a graph illustrating multiple operating point check by performing a voltage sweep on one of the nodes in the ring oscillator and measuring current in the ring oscillator, according to the embodiments as disclosed herein.

FIG. 3 and FIG. 4 illustrate multiple operating points (MOP) in the even staged CMOS ring oscillator, according to the embodiments as disclosed herein.

An example of a four stage oscillator has been illustrated in FIG. 3. It is to be noted that the solution and analysis apply equally to any even staged CMOS ring oscillator. A single stage with the main inverters and cross coupled inverters has been marked in FIGS. 3 and 4. The main inverters in the ring oscillator form a ring like structure. There are two inverters in every stage cross coupled between the differential outputs. The ratio of the size of the cross coupled inverter to the main inverter is called the latch ratio.

In general, an issue with the even staged CMOS ring oscillator is the presence of multiple operating points. For most values of latch ratios in the range (0,1) there are two stable (Q1, Q3) and one unstable (Q2) equilibrium points regardless of the number of stages as long as the number of stages is even. This is because the ring oscillator has both positive feedback and negative feedback. There is positive feedback in the common mode path and negative feedback in the differential path. Positive feedback (with gain>1) can lead to multiple operating points.

Multiple operating points can be detected by using the technique shown in FIG. 4. The checking point is to connect a voltage source across any one of the nodes of the oscillator and ground. Any node can be chosen due to symmetry and the result would be the same. The voltage may be swept between the ground and the voltage supply and the current drawn from the voltage source may be measured. The voltages for which the current drawn is zero correspond to equilibrium points. There are three such points labelled as Q1, Q2 and Q3 (two stable equilibrium points are Q1 and Q3 and unstable equilibrium point is Q2) marked in FIG. 5. Examining the slope of the measured current at the equilibrium points can give a clue about the stability of these equilibrium points. A negative slope may mean a stable operating point and a positive slope may mean an unstable equilibrium point. These points may be verified using a stability analysis done using the Nyquist stability criterion.

By varying the latch ratio, it may be possible to move two stable equilibrium points (Q1 and Q3) closer to unstable equilibrium point (Q2) to create three unstable equilibrium points. For lower latch ratios, the gain of the positive feedback loop at two stable equilibrium points (Q1 and Q3) may be low, leading to the stable operating point. When the latch ratio is increased, two stable equilibrium points (Q1 and Q3) move closer to unstable equilibrium point (Q2) with the differential path dominating and consequently creating instability.

The MOP in the ring oscillator is explained in FIG. 4. The multiple operating point check measures current on any of the eight nodes by sweeping voltage on one of the eight nodes in the ring oscillator. The eight nodes will yield the same result due to symmetry, and, for example, two stable equilibrium points (Q1 and Q3) and one unstable equilibrium point (Q2) can be observed.

Figure 6:
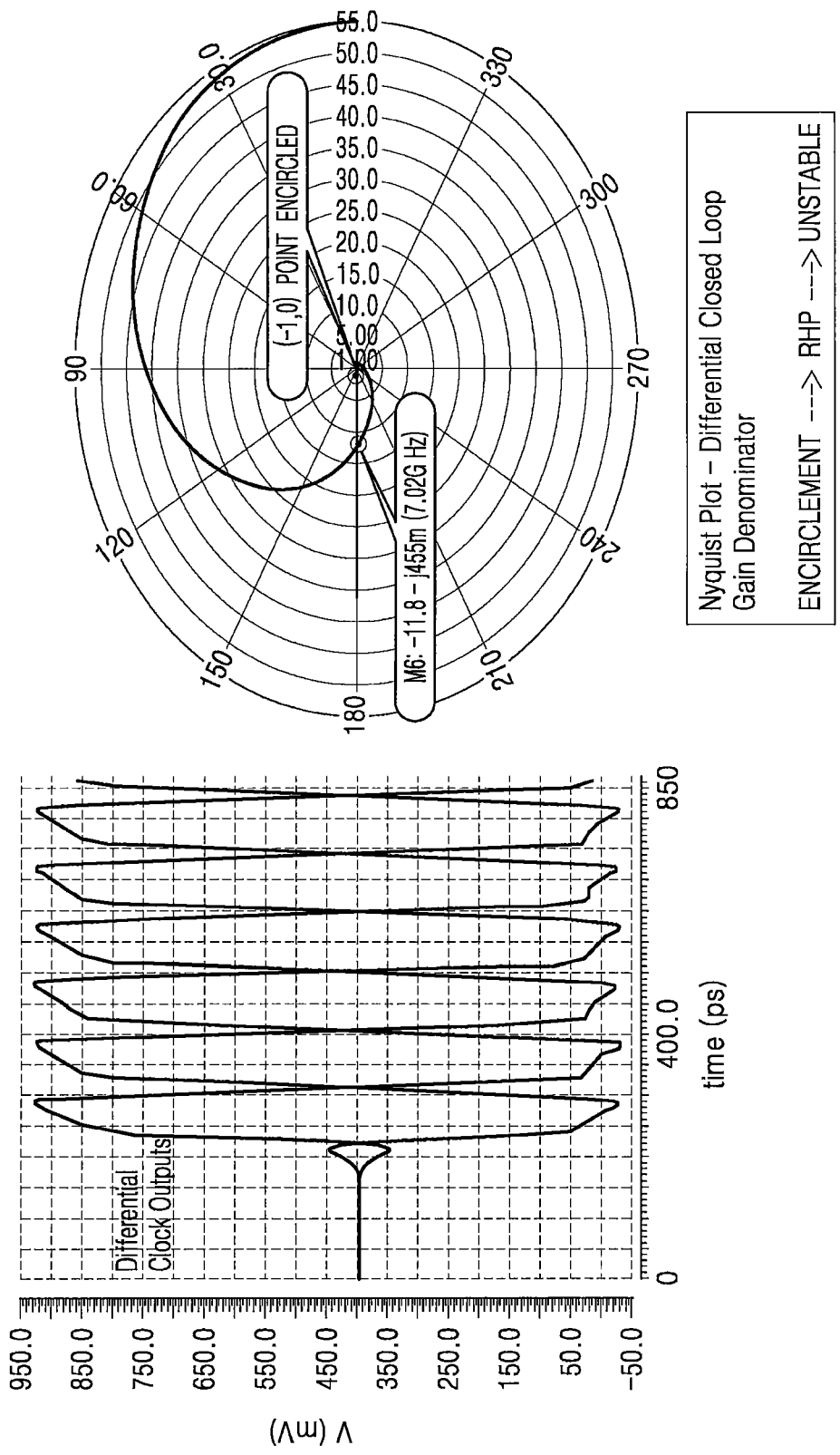
FIG. 6 is a graph illustrating a stability check in an unstable equilibrium point, according to the embodiments as disclosed herein.

FIG. 6 is a graph illustrating a stability check in the unstable equilibrium point (Q2), according to the embodiments as disclosed herein. As shown in FIG. 6, the differential loop gain shows encirclement of the (−1, 0) point in the Nyquist plot. This means that the closed loop transfer function has a right half plane pole and is unstable. This is shown by the transient oscillations observed when the oscillator is initialized in the unstable equilibrium point (Q2).

Figure 7:
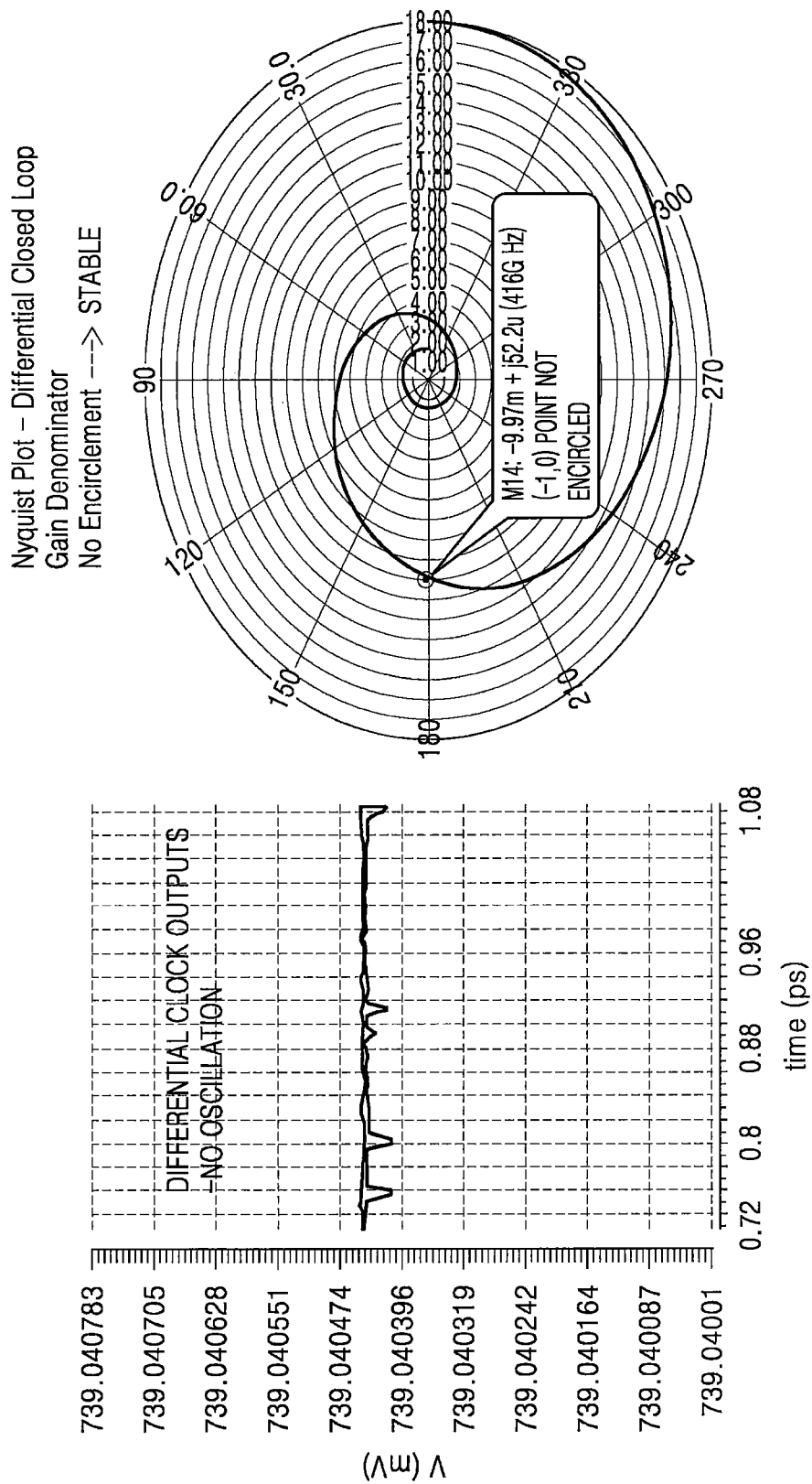
FIG. 7 is a graph illustrating a stability check in a stable equilibrium point, according to the embodiments as disclosed herein.

FIG. 7 is a graph illustrating a stability check in the stable equilibrium point (Q1), according to the embodiments as disclosed herein. As shown in FIG. 7, the differential loop gain shows no encirclement of the (−1, 0) point in the Nyquist plot. This means that the closed loop transfer function is stable. This is shown by the lack of transient oscillations observed when the ring oscillator is initialized in the stable equilibrium point (Q1).

Figure 8:
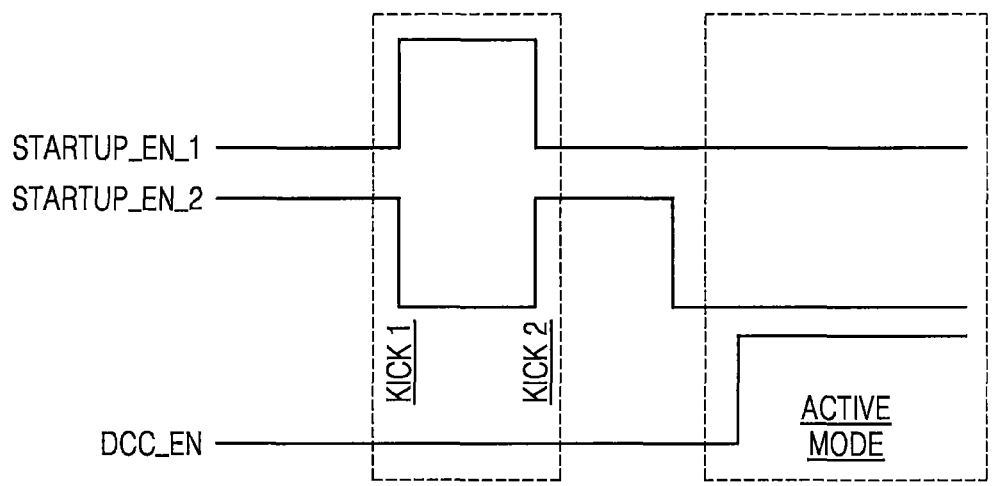
FIG. 8 is a timing diagram illustrating a timing control of start-up signals to get a maximum differential kick amplitude in the ring oscillator, according to the embodiments as disclosed herein.

FIG. 8 is a timing diagram illustrating a timing control of start-up signals to get a maximum differential kick amplitude in the ring oscillator, according to the embodiments as disclosed herein.

In FIG. 8, the timing diagram for the start-up signals is shown. The start-up may be controlled using the switches S1-S4 with the signals STARTUP_EN_1 and STARTUP_EN_2 and S5-S6 with the signal DCC_EN in stage 1 of the ring oscillator. Equivalent (e.g., substantially the same) signals may be generated for every stage of the ring oscillator. Since the stages and the timing signals may be the same for all stages, only signals corresponding to a single stage are detailed. During a power down state and until before a startup state (the oscillator could be in a latched up condition), STARTUP_EN_1=0, STARTUP_EN_2=1 and DCC_EN=0 (see FIG. 2). This ensures that the DCC is powered down and the switches initialize the voltage at the input of DCC. These nodes are marked as VCO_1_Cc and VCO_2_Cc (see FIG. 2). The signals may then be switched to STARTUP_EN_1=1, STARTUP_EN_2=0 and DCC_EN=0. This may provide the first of the two differential start up kicks (KICK1 in FIG. 8). The second differential start up kick (KICK2 in FIG. 8) may be provided by switching the signals to STARTUP_EN_1=0, STARTUP_EN_2=1 and DCC_EN=0. The DCC may then be enabled by setting DCC_EN=1. Further, the switches may be disabled by setting STARTUP_EN_1=0, and STARTUP_EN_2=0. This corresponds to the active mode of operation wherein the oscillator functions with the start-up circuitry disabled. The complementary switching of signals "STARTUP_EN_1" and "STARTUP_EN_2" simultaneously to control switches S1, S2, S3, and S4 when switches S5 and S6 remain turned off using the signal "DCC_EN" is termed as a "KICK" in FIG. 8. This is the differential start up kick that forcibly moves the oscillator close to the unstable equilibrium point.

Figure 9:
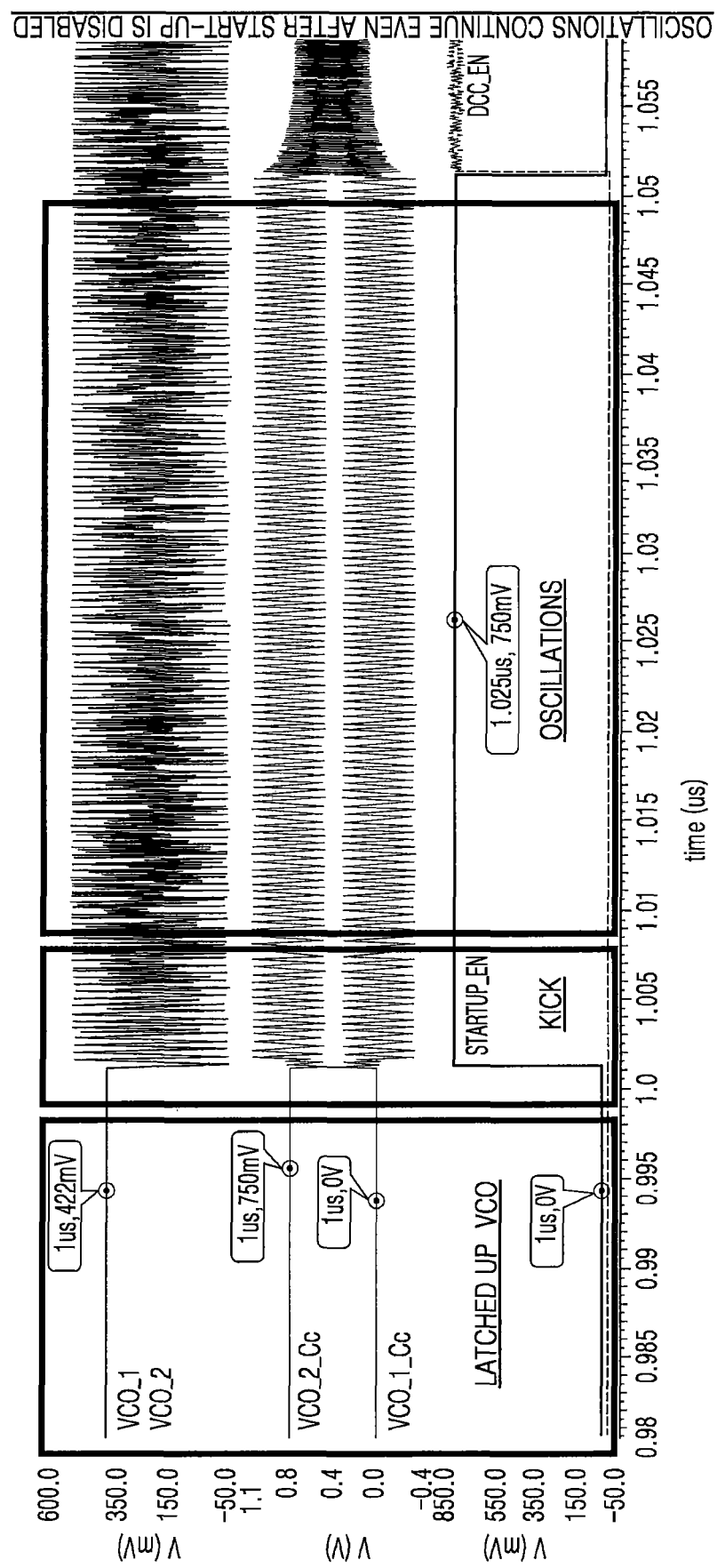
FIG. 9 and FIG. 10 are graphs illustrating a differential start-up timing diagram, according to the embodiments as disclosed herein.
Figure 10:
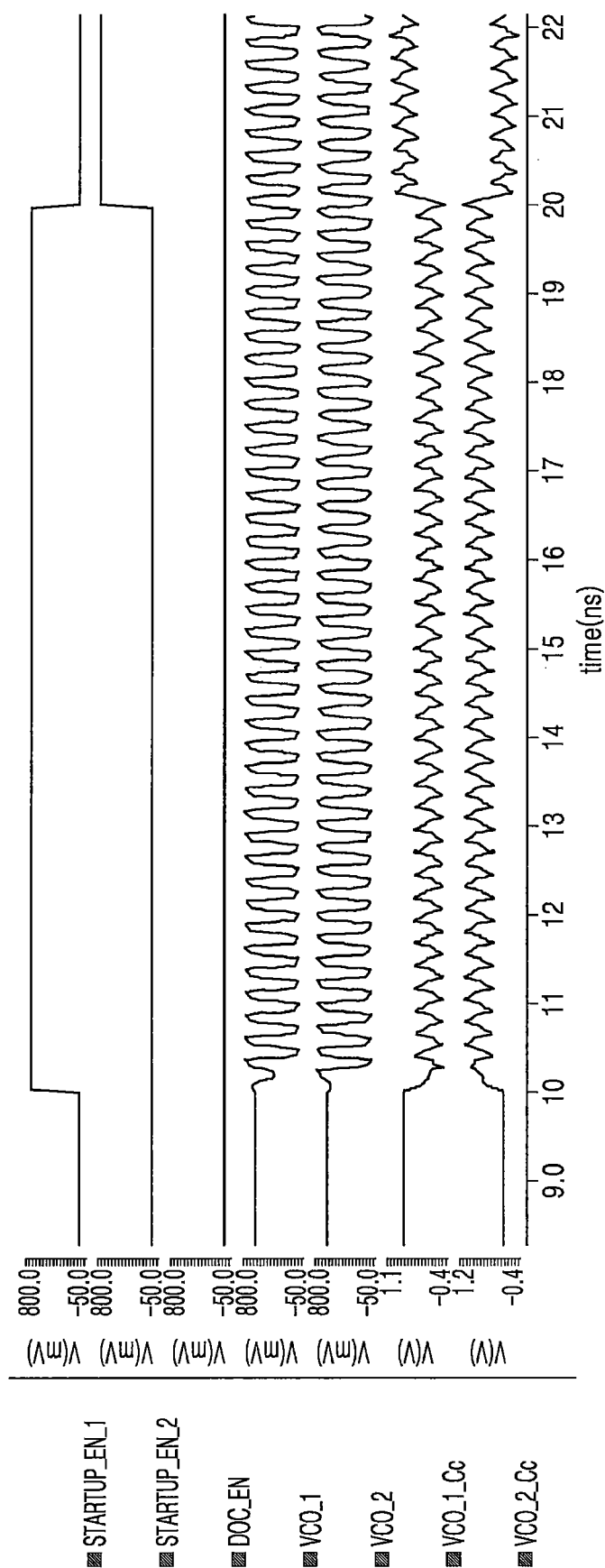

FIG. 9 and FIG. 10 are graphs illustrating a differential start-up timing diagram, according to the embodiments as disclosed herein. As shown in FIG. 9, the graph corresponding to the nodes marked in FIG. 2. The outputs of the oscillator stage VCO_1 and VCO_2 and the DCC input nodes VCO_1_Cc and VCO_2_Cc and all the three startup signals (STARTUP_EN_1 and STARTUP_EN_2, as STARTUP_EN, and DCC_EN) are shown. The simulation assumes a case where the oscillator is initially in a latched up state. The first startup kick denoted by "KICK1" moves the oscillator from the latched up state into the oscillatory state. The subsequent differential start up kick denoted by "KICK2" does not affect the oscillations. In case "KICK1" is unable to cause oscillations, "KICK2" helps start oscillations. After a time delay, the switches S1, S2, S3, and S4 are turned off by using the signals STARTUP_EN_1 and STARTUP_EN_2 signals and the signal DCC_EN is used to unmask the oscillator output. It can be observed that the oscillator continues to oscillate after the start up signals have been disabled.

The ring oscillator moves through three states. Initially in the latched up state, both nodes of each stage of the ring oscillator are at the same voltage. Based on the startup timing sequence the nodes VCO_2_Cc and VCO_1_Cc are at supply and ground voltages respectively. When the startup kick is applied, the ring oscillator moves away from Q1/Q3 into Q2 and starts oscillating. Now after the startup circuit is disabled and the DCC is enabled, the amplitude and frequency of oscillation change. The zoomed in version of the start-up kick inducing oscillations is shown in FIG. 10.

Figure 11A:
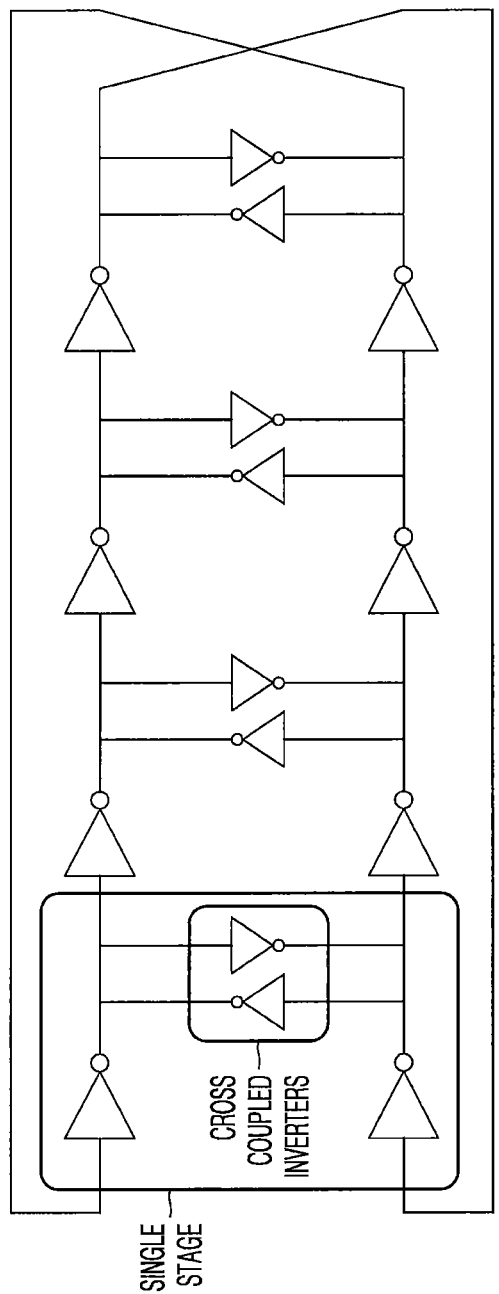
FIGS. 11A-FIG. 11D show transient steps of the start-up mechanism in the ring oscillator, according to the embodiments as disclosed herein.
Figure 11B:
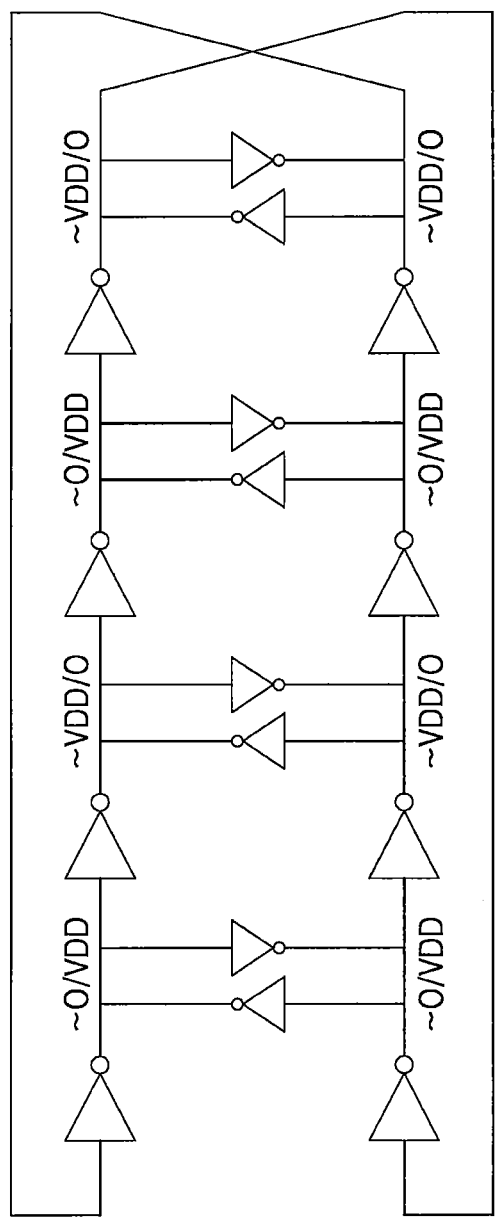
Figure 11C:
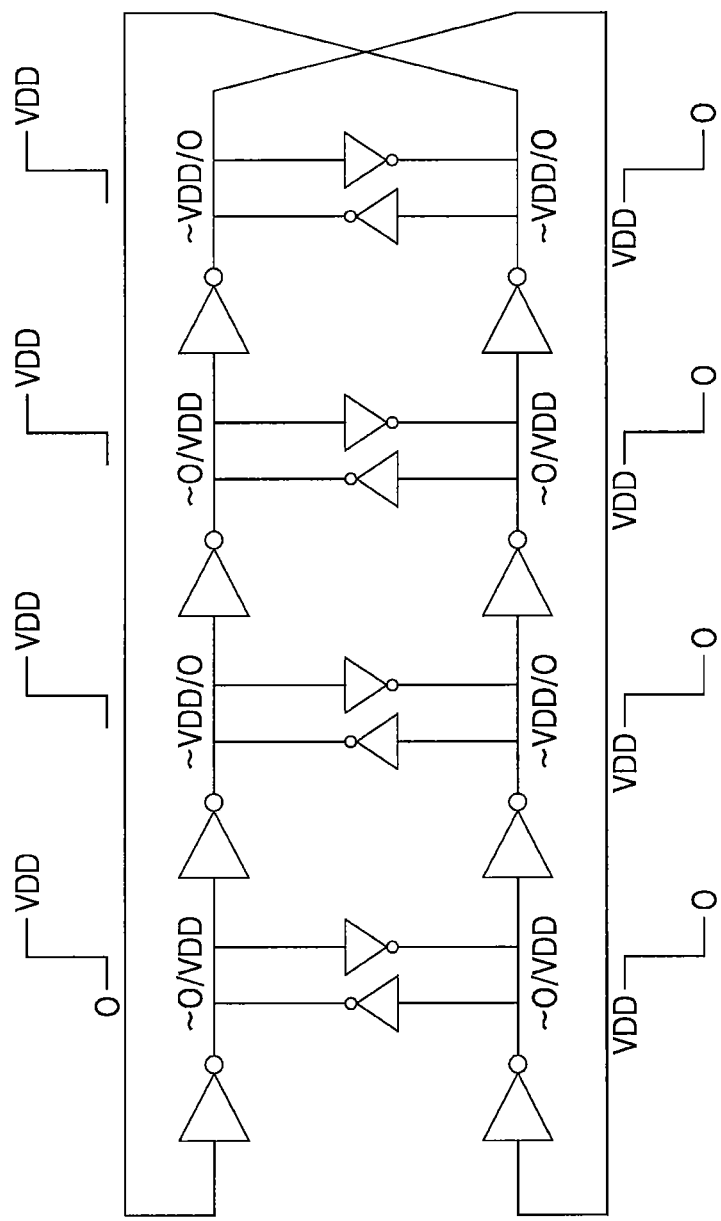

FIGS. 11A-FIG. 11D show the transient steps of the start-up mechanism in the ring oscillator, according to the embodiments as disclosed herein. Taking a four stage oscillator as an example in FIG. 11A and the diagrams illustrate the ring oscillator in the latched up state. There are two possible latch states. These are referred to herein as Q1 and Q3 (see FIG. 5). The voltage of every node of the ring oscillator is close to either ground or supply in stable equilibrium points (Q1 and Q3). This is shown in FIG. 11B. The same differential start up kick is applied to all stages of the ring oscillator with the polarity reversed for consecutive stages. This is shown in FIG. 11C. Once the kick has been applied, the direction in which the node voltages move has been shown in FIG. 11D. This takes the node voltages closer to the unstable equilibrium point (Q2). This lets the oscillator nodes fall into the trajectory of the periodic steady state.

Figure 11D:
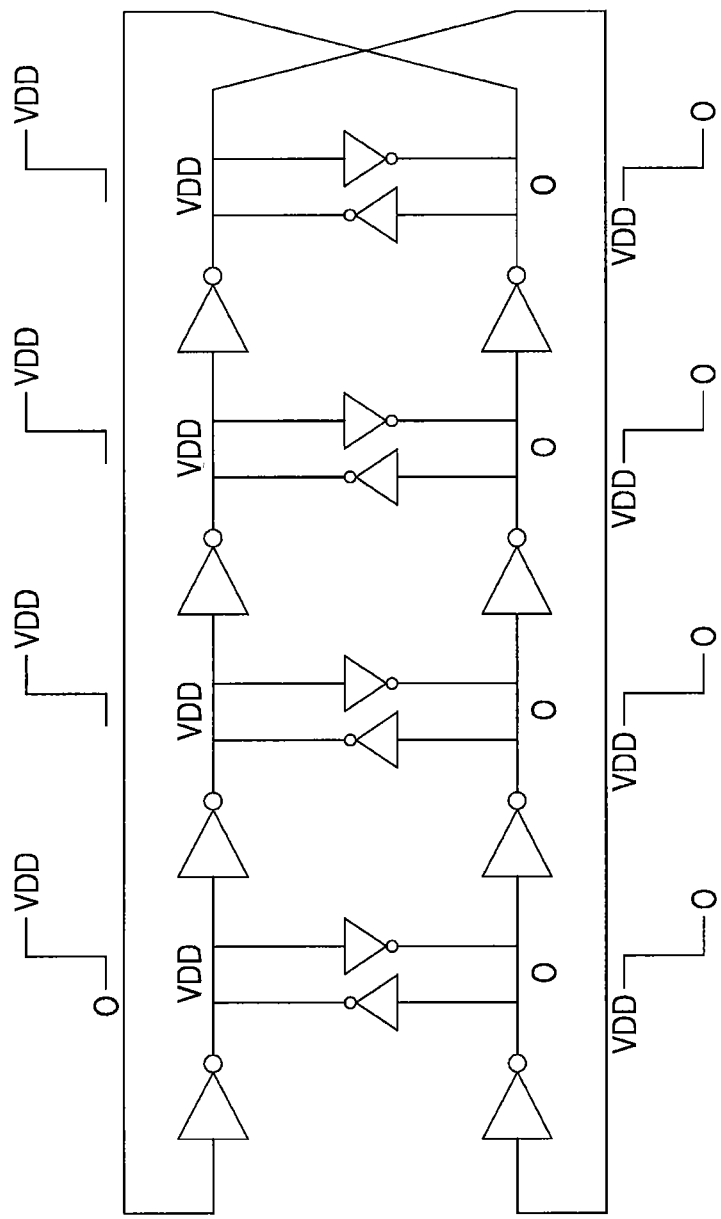

Further, the differential start up kick magnitude to be applied may be determined based on the node voltages in states Q1, Q2, and Q3 and the ring supply voltage. The impedance seen looking into the nodes of the ring oscillator may be computed. Based on the switch resistance and capacitance, the value of the AC coupling capacitor (Cc) may be decided. If the magnitude of the differential start up kick is small, the ring oscillator will continue to stay in the stable operating point. The magnitude of the differential start up kick is preferably large enough to push the oscillator closer to Q2 than Q1 or Q3. FIG. 11D shows that the differential start up kick causes the nodes of the oscillator to move towards supply (VDD) or ground from being in a latched up state as shown in FIG. 11C.

Figure 12:
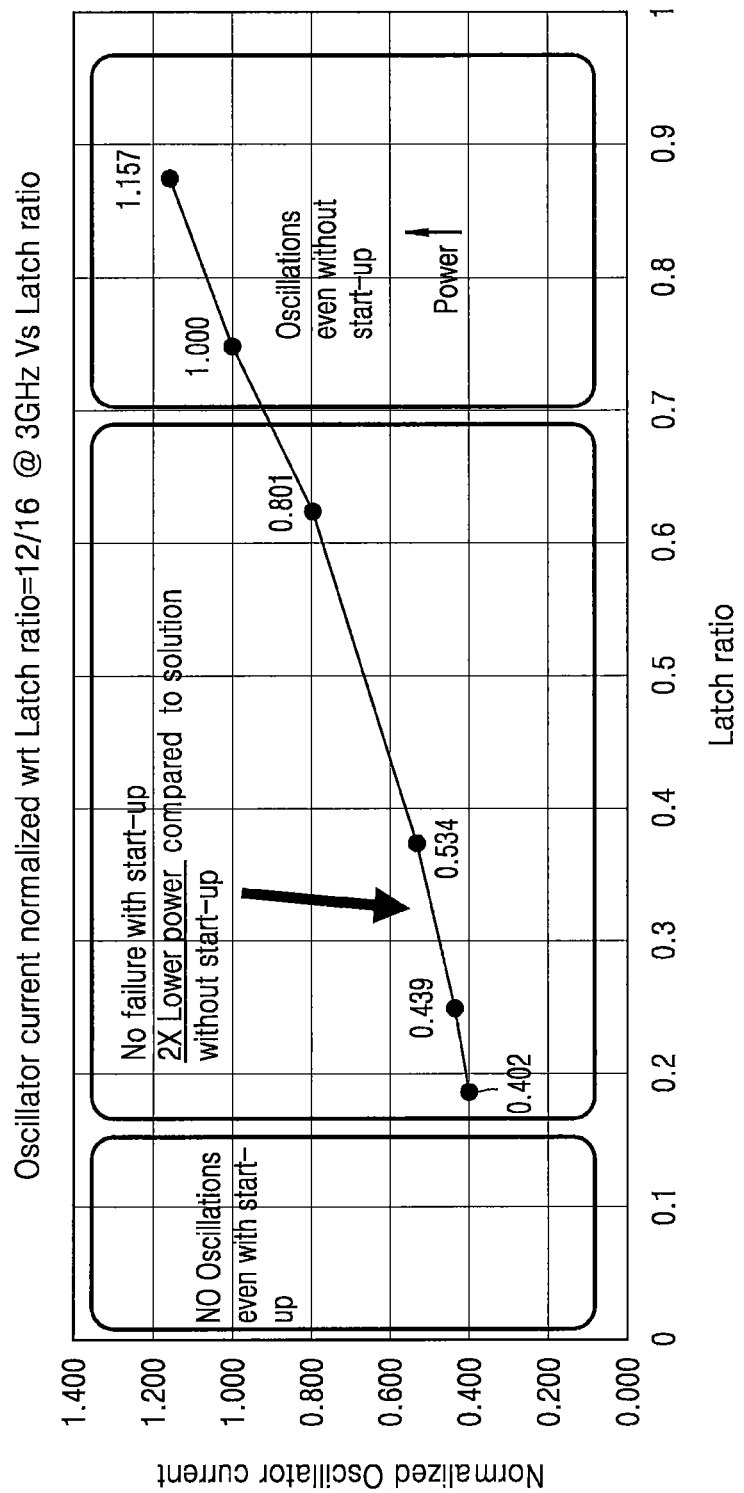
FIG. 12 is a graph illustrating an oscillator current normalized with respect to a latch ratio, according to the embodiments as disclosed herein.

FIG. 12 is a graph illustrating an oscillator current normalized with respect to the latch ratio, according to the embodiments as disclosed herein.

The latch ratio is defined as the ratio of the cross coupled inverter to the main inverter in the oscillator stage. FIG. 12 shows the normalized oscillator current needed with and without the proposed startup solution. Normalized oscillator current refers to the oscillator current obtained for different latch ratios divided by the oscillator current corresponding to the latch ratio that does not require startup to work reliably without failures. There are three distinct regions marked in FIG. 12. In the first region with low latch ratios, the oscillator does not start up. In the second region, the oscillator works if the proposed start up solution is used. But without it, there are higher chances of failure. In the third region, where the latch ratio is high, the oscillator works without the need for start-up.

Figure 13:
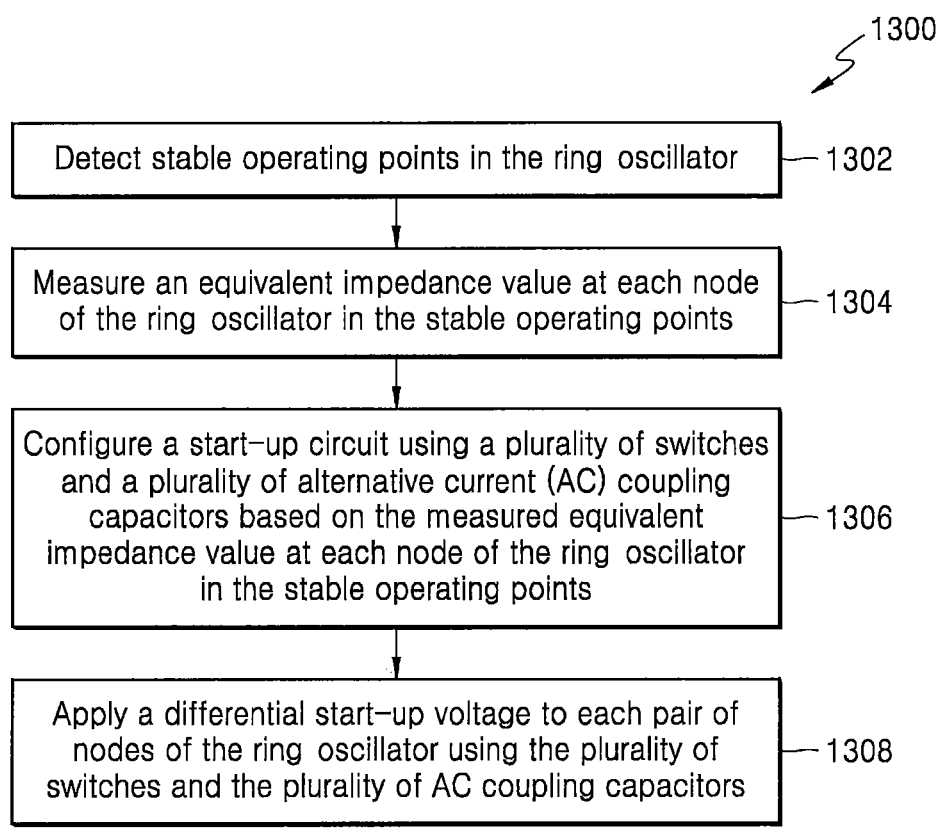
FIG. 13 is a flow chart illustrating a method for controlling start-up of the ring oscillator, according to the embodiments as disclosed herein.

FIG. 13 is a flow chart 1300 illustrating a method for controlling start-up of the ring oscillator, according to the embodiments as disclosed herein. At 1302, the method includes detecting the stable operating points in the ring oscillator. At 1304, the method includes measuring the equivalent impedance value at each node of the ring oscillator in the stable operating points. At 1306, the method includes configuring the start-up circuit using the plurality of switches (S1-S4) and the plurality of alternative current (AC) coupling capacitors (Cc) based on the measured equivalent impedance value at each node of the ring oscillator in the stable operating points. At 1308, the method includes applying the differential start-up voltage to each pair of nodes of the ring oscillator using the plurality of switches (S1-S4) and the plurality of AC coupling capacitors (Cc). In some embodiments, the method can be used to apply the differential start-up voltage to each pair of nodes of the ring oscillator using the plurality of switches (S1-S4) and the plurality of AC coupling capacitors (Cc), so that the ring oscillator is away from the detected stable operating points in which the ring oscillator may be latched up.

The various actions, acts, blocks, steps, or the like in the flow diagram 1300 may be performed in the order presented, in a different order or simultaneously. Further, in some embodiments, some of the actions, acts, blocks, steps, or the like may be omitted, added, modified, skipped, or the like without departing from the scope of the invention.

The embodiments disclosed herein can be implemented using at least one software program running on at least one hardware device and performing network management functions to control the elements.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

What is claimed is:

1. A ring oscillator comprising:
   at least one oscillator stage having a first output and a second output; and
   a start-up circuit comprising:
   a plurality of alternative current (AC) coupling capacitors receiving the first output and the second output; and
   a plurality of switches connected to the plurality of AC coupling capacitors, wherein the start-up circuit is configured to provide a differential start-up voltage to at least one node of the ring oscillator using the plurality of switches and the plurality of AC coupling capacitors,
   wherein the differential start-up voltage starts up oscillations in the ring oscillator when the ring oscillator is latched up in a stable operating point.

2. The ring oscillator of claim 1, wherein the plurality of AC coupling capacitors and the plurality of switches are configured by a timing circuitry to provide the differential start-up voltage to the at least one node of the ring oscillator.

3. The ring oscillator of claim 1, wherein the start-up circuit does not load outputs of the ring oscillator in an active mode.

4. The ring oscillator of claim 1, wherein a latch ratio is adjusted in the at least one oscillator stage to control differential gain in the ring oscillator.

5. The ring oscillator of claim 4, wherein the latch ratio corresponds to a ratio of a cross coupled inverter to a main inverter in the at least one oscillator stage.

6. The ring oscillator of claim 1, wherein the start-up circuit is configured to provide the differential start-up voltage to the at least one node of the ring oscillator using the plurality of switches and the plurality of AC coupling capacitors by:
   detecting stable operating points in the ring oscillator;
   measuring an equivalent impedance value at each node of the ring oscillator in the stable operating points;
   configuring the start-up circuit using the plurality of switches and the plurality of AC coupling capacitors based on the measured equivalent impedance value; and
   applying the differential start-up voltage to the at least one node of the ring oscillator using the plurality of switches and the plurality of AC coupling capacitors.

7. The ring oscillator of claim 6, wherein the equivalent impedance value at each node of the ring oscillator is measured by using small signal analysis at the stable operating points.

8. The ring oscillator of claim 7, wherein the small signal analysis at the stable operating points is used for calculating the differential start-up voltage of the ring oscillator, and wherein the differential start-up voltage of the ring oscillator is calculated by:
   determining a supply voltage of the ring oscillator corresponding to every process, voltage and temperature (PVT) condition of the ring oscillator; and computing the differential start-up voltage to be applied based on the detected stable operating points, an unstable equilibrium point, and the determined supply voltage.

9. The ring oscillator of claim 8, wherein stability of the unstable equilibrium point is evaluated using Nyquist stability criteria.

10. The ring oscillator of claim 6, wherein the stable operating points are identified using a multi operating point check procedure.

11. The ring oscillator of claim 1, wherein the ring oscillator is an even staged complementary metal oxide semiconductor (CMOS) ring oscillator.

12. A ring oscillator comprising an even number of stages, wherein each respective stage is coupled to a duty cycle corrector (DCC), the DCC comprising:
  an AC coupling capacitor that is coupled to an input of the DCC; and
  a first switch coupled to a first voltage and a second switch coupled to a second voltage,
    wherein the first switch and the second switch are configured to provide a differential start-up voltage to the respective stage of the ring oscillator using the AC coupling capacitor,
  wherein the differential start-up voltage starts up oscillations in the ring oscillator when the ring oscillator is latched up in a stable operating point.

13. The ring oscillator of claim 12, wherein the first switch and the second switch are configured to be alternately activated so as to provide the differential start-up voltage to the respective stage.

14. The ring oscillator of claim 13, wherein the DCC further comprises an inverter and a third switch configured to bypass the inverter, and
  wherein the third switch is configured to be open responsive to the first switch and the second switch being alternately activated so as to provide the differential start-up voltage to the respective stage.

15. The ring oscillator of claim 13, wherein the first switch and the second switch are further configured to be open during operation of the ring oscillator.

16. The ring oscillator of claim 12, wherein the respective stage is a first stage of the ring oscillator, and
  wherein an output of the DCC is coupled to a second stage of the ring oscillator.

17. The ring oscillator of claim 12, wherein the first voltage is a supply voltage, and the second voltage is a ground voltage.

18. The ring oscillator of claim 12, wherein the first switch is one of a plurality of first switches, wherein the second switch is one of a plurality of second switches, wherein the AC coupling capacitor is one of a plurality of AC coupling capacitors, and wherein the respective stage comprises a plurality of main inverters, with a plurality of cross-coupled inverters coupled therebetween.

19. The ring oscillator of claim 18, wherein a latch ratio between the plurality of main inverters and the plurality of cross-coupled inverters is configured based on an equivalent impedance value measured at each stage of the ring oscillator in stable operating points of the ring oscillator.

* * * * *